US006999528B2

(12) United States Patent
Brankovic et al.

(10) Patent No.: US 6,999,528 B2
(45) Date of Patent: Feb. 14, 2006

(54) I/Q DEMODULATOR DEVICE WITH THREE POWER DETECTORS AND TWO A/D CONVERTERS

(75) Inventors: Veselin Brankovic, Esslingen (DE); Dragan Krupezevic, Stuttgart (DE); Mohamed Ratni, Esslingen (DE); Masayoshi Abe, Kanagawa (JP); Noboru Sasho, Kanagawa (JP)

(73) Assignee: Sony International (Europe) GmbH, Berlin (DE)

( * ) Notice: Subject to any disclaimer, the term of this patent is extended or adjusted under 35 U.S.C. 154(b) by 793 days.

(21) Appl. No.: 09/947,145

(22) Filed: Sep. 5, 2001

(65) Prior Publication Data

US 2002/0044613 A1    Apr. 18, 2002

(30) Foreign Application Priority Data

Sep. 6, 2000 (EP) .................................. 00119506

(51) Int. Cl.
*H03D 3/22* (2006.01)
*H04L 27/22* (2006.01)

(52) U.S. Cl. .................... 375/329; 375/322; 375/279; 375/308; 455/205

(58) Field of Classification Search ................ 329/306, 329/304; 375/345, 329, 322, 279, 308; 455/205
See application file for complete search history.

(56) References Cited

U.S. PATENT DOCUMENTS

| | | | |
|---|---|---|---|
| 4,112,497 A * | 9/1978 | Fletcher et al. ............. | 708/422 |
| 4,318,049 A * | 3/1982 | Mogensen .................. | 329/308 |
| 4,614,945 A * | 9/1986 | Brunius et al. ......... | 340/870.03 |
| 4,700,108 A * | 10/1987 | Morse ........................ | 315/5.41 |
| 4,989,262 A * | 1/1991 | Saito .......................... | 455/138 |
| 5,491,726 A * | 2/1996 | Cheng et al. ............... | 375/343 |
| 5,894,496 A * | 4/1999 | Jones ......................... | 455/126 |
| 6,340,883 B1 * | 1/2002 | Nara et al. ............... | 324/76.78 |
| 6,625,427 B1 * | 9/2003 | Kayano et al. .......... | 455/115.1 |
| 6,803,814 B1 * | 10/2004 | Krupezevic et al. ........ | 329/306 |
| 2002/0141478 A1 * | 10/2002 | Ozluturk et al. ............ | 375/130 |
| 2002/0141517 A1 * | 10/2002 | Hayashi ..................... | 375/345 |

FOREIGN PATENT DOCUMENTS

| | | |
|---|---|---|
| EP | 841756 A2 * | 5/1998 |
| EP | 0 884 836 | 12/1998 |
| EP | 0 896 455 | 2/1999 |
| EP | 957573 A1 * | 11/1999 |
| WO | WO 99 33166 | 7/1999 |

* cited by examiner

*Primary Examiner*—Stephen Chin
*Assistant Examiner*—Erin M. File
(74) *Attorney, Agent, or Firm*—Frommer Lawrence & Haug LLP; William S. Frommer

(57) ABSTRACT

The present invention relates to a method and a device for the I/Q demodulation of modulated RF signals. The I/Q demodulator (60) has a first input for the RF signal (61) to be demodulated and a second input for a RF signal (62) originating from a local oscillator (20). The demodulator (60) combines the two RF signals (61,62) to generate three output signals supplied to three power detectors. In a combination unit (70) the three power signals of the power detectors are merged in two signal branches wherein after passing an A/D converting (72) and digital processing unit (73) one signal is the I component and the other one is the Q component of the received modulated RF signal (61).

14 Claims, 5 Drawing Sheets

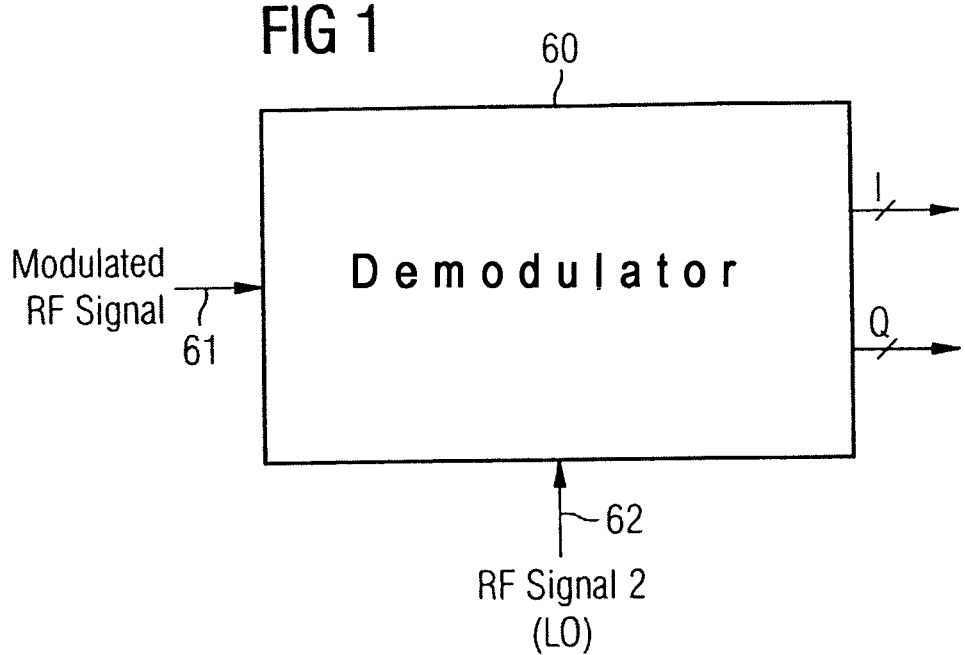
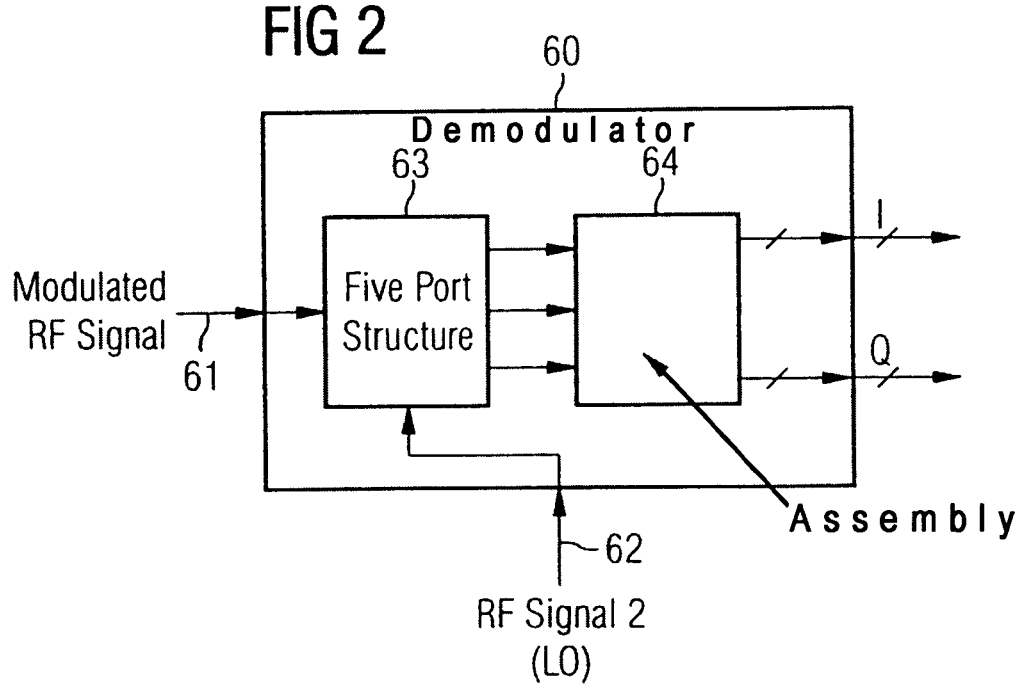

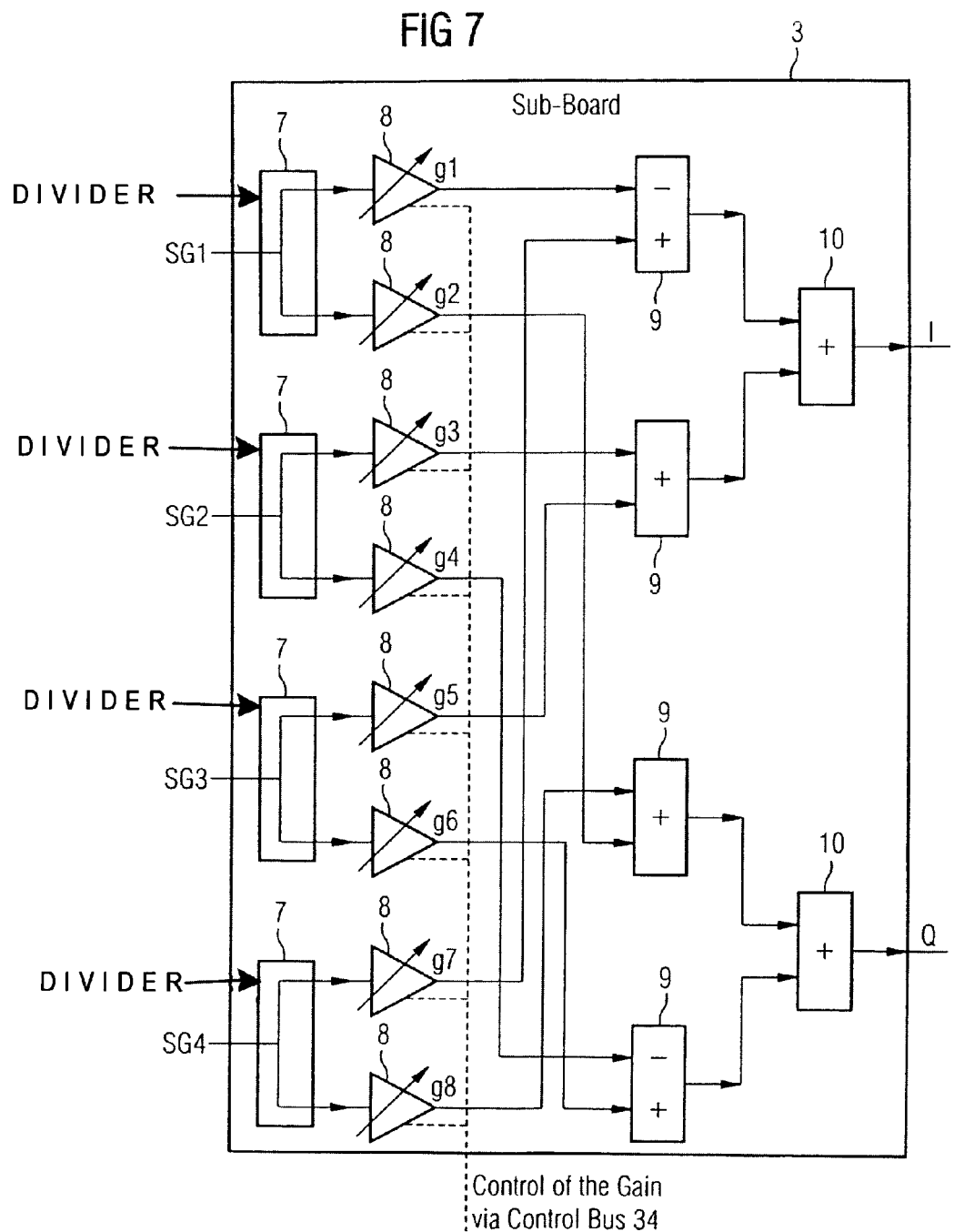

I/Q DEMODULATOR DEVICE WITH THREE POWER DETECTORS AND TWO A/D CONVERTERS

The present invention relates to a method and a device for the I/Q demodulation of modulated RF signals. The invention furthermore relates to a telecommunications device comprising such a demodulating device.

A six-port receiver is known acting in a direct conversion manner and allowing conversion from millimeter wave range and microwave range directory to the base band. The six-port receiver detects the relative phase and relative magnitude of two incoming RF-signals by using the information of superimposed RF signals. At the same time a classic I/Q demodulation chip (digital or analog) can be avoided. By using suitable calibration procedures the influences of the non-ideal, linear RF-components including manufacturing tolerances can be minimized. The circuitry of the six-port receiver is realized using only passive components in combination with power sensors for the detection of the relative phase and the relative magnitude of the RF-signals as shown in EP-A-0896455.

In Bossisio, Wu "A six-port direct digital millimeter wave receiver", Digest of 1994 IEEE MTT Symposium, vol. 3, page 1659–1662, San Diego, May 1994, a structure for a six-port receiver is proposed.

The six-port technique has been known for its ability to accurately measure the scattering parameters, both amplitude and phase, of microwave networks. Instead of using heterodyne receivers a six-port receiver accomplishes direct measurements at microwave and mm-wave frequencies by extracting power levels at at least three different ports. The imperfections of the hardware can be readily eliminated by an appropriate calibration procedure. Very accurate measurements can be made in a large dynamic range and wide frequency range. Six-port junction receivers consist of microwave components such as e.g. directional couplers and power dividers as well as power sensors. The circuit can be easily integrated as MHMIC or MMIC. The known receiver performs direct phase/amplitude demodulation at microwave and mm-wave frequencies.

By performing a calibration procedure the hardware imperfections can be readily eliminated. This significantly eases the requirement of the hardware implementation and enables the six-port receiver to operate over a wide band up to mm-wave frequencies.

According to the above cited document of Bossisio et. al. a six-port receiver concept with power dividers and 90 degrees hybrid circuits realized in distributed technology is used. The application of that known structure lies mainly in the frequency bands above 10 GHz, however, it suffers from an insufficient band width of the operation due to the inherently frequency selective nature of the 90 degree hybrid circuits.

From D. Maurin, Y. Xu, B. Huyart, K. Wu, M. Cuhaci, R. Bossisio "CPW Millimeter-Wave Six-Port Reflectometers using MHMIC and MMIC technologies", European Microwave Conference 1994, pp. 911–915, a wide-band topology for reflectometer used is known which is based on a distributing element approach featuring coplanar wave guide applications in the frequency range from 11 to 25 GHz.

From V. Bilik, et al. "A new extremely wideband lumped six-port reflectometer" European Microwave Conference 1991, pp. 1473–1477 and the idea of using Wheatstone Bridges and resistive structures for reflectometer applications is known.

From Li, G. Bossisio, K. Wu, "Dual tone Calibration of Six-Port Junction and its application to the six-port direct digital receiver", IEEE Transactions on Microwave Theory and Techniques, vol. 40, January 1996 a six-port reflectometer topology based on four 3 dB hybrid circuits, power dividers and attenuators is known.

From U.S. Pat. No. 5,498,969 an asymmetrical topology for a reflectometer structure featuring one matched detector and three unmatched detectors is known.

From U.S. Pat. No. 4,521,728 with the title "Method and six-port network for use in determining complex reflection coefficients of microwave networks" a reflectometer six-port topology is known comprising two different quadrate hybrids, phase shifter, two power dividers and one directional coupler for which the realization by a microstrip line technology is disclosed.

From EP-A-0 805 561 a method for implementing a direct conversion receiver with a six-port junction is known. According to this known technique, modulated transmitted modulation is received by a direct conversion receiver which comprises a six-port junction. The demodulation is carried out in an analog manner.

From EP-A-0 841 756 a correlator circuit for a six-port receiver is known. In this correlator circuit the received signal is summed up with a local oscillator signal at various phase angles, wherein the phase rotation between the local oscillator and RF signals is carried out separately from the summing of the correlator outputs.

From EP 0 957 573 A1 a five port junction device for processing (down conversion etc.) of RF signals is known. According to FIG. 5 the device comprises one passive four-port means 41 being connected with a passive three-port means 42 by a phase-shifting element 43. The passive four-port means 41 comprises a port 44 for the input of a first RF signal and two output ports. The passive three-port means 42 comprises a second port 44 for the input of a second RF signal and one output port. The output ports respectively provide output signals being linear combinations of the first and the second RF input signal. Power sensors $P_1$, $P_2$, $P_3$ are provided to detect the respective power levels of the output signals. Respectively one power sensor can be connected to one of said output ports and a signal processing unit 45 is provided to calculate the complex ratio of the first and second input RF signals on the basis of the power level values detected and output by the power sensors $P_1$, $P_2$, $P_3$.

The disadvantage of this five port junction device is that three A/D converters are necessary.

From EP 0 957 614 A1 a n-port demodulator for PSK or QAM signals is known. In the case of n=5 the I/Q-demodulator thereby comprises a passive five-port junction device 1 as it is described above. According to FIGS. 6 and 7, three power detectors $P_1$, $P_2$, $P_3$ are then provided being supplied with analog signals output of the five-port junction device 1. The analog circuitry 2,3 detects I/Q components of the signal to be demodulated based on an analog processing of the analog signals output of the power detectors $P_1$, $P_2$, $P_3$. A local oscillator circuitry 20 is provided to supply a second input signal for the five-port junction device 1. Filters 4 are provided for filtering the analog signals output of the power detectors $P_1$, $P_2$, $P_3$ before they are supplied to the analog circuitry 2,3. The analog circuitry 3 comprises circuits 7 to supply the analog signals output of the power detectors $P_1$, $P_2$, $P_3$ respectively in two branches. Furthermore amplifiers 8 with individually adjustable gain (g1, g2, g3, g4, g5, g6, g7, g8) are provided to amplify the branches. Finally an adding/subtracting circuitry 9,10 is provided being supplied with the individually amplified branches to detect I/Q components of the RF signal to be demodulated (signal 1). In the I/Q output circuit 33, for example, an A/D conversion of the input I and Q components can be effected.

The disadvantage of this five-port demodulator is that the analog processing part 2,3 is more complex due to the high number of DC amplifiers and subtracting and adding circuitries. Furthermore this approach doesn't allow for calibration procedures to be easily applied.

It is the object of the present invention to provide an I/Q demodulator and a method for demodulating which utilizes a more simple analog processing and which reduce the number of A/D converters to two. This approach reduces and optimizes the complexity of the hardware as well as the power consumption. At the same time the calibration characteristics are left unchanged.

This object is achieved by means of the features of the independent claims. The dependent claims develop further the central idea of the invention.

According to the present invention an I/Q demodulator is provided. The demodulator has a first input for the RF signal to be demodulated and a second input for a RF signal originating from a local oscillator, wherein the two RF signals are combined to generate three output signals for three power detectors. A combination unit is provided for combining the three power signals of the power detectors to two signal branches.

One of the three power signals can be split in two subbranches.

The signals of the two subbranches can be adjustable.

Each subbranch can be combined with respectively one of the remaining two power signals by an adder.

Each of the signal branches can be supplied to an A/D converter.

The outputs of the A/D converter can be supplied to a digital processing unit.

Furthermore a mobile communication device comprising an I/Q demodulator as set forth is proposed.

According to the present invention furthermore a method for demodulating a high frequency signal is provided. Thereby three output signals for power detectors are generated by combining the RF signal to be demodulated with a second RF signal originating from a local oscillator. The three power signals of the power detectors are combined to two signal branches.

Further advantageous features of the method according to the present invention are defined in the subclaims.

Further advantages, features and objects of the present invention will come clear from the following detailed description of embodiments of the present invention taken in conjunction with the accompanying drawings:

FIG. 1 shows a general view of the proposed I/Q demodulator,

FIG. 2 shows subparts of the proposed I/Q demodulator,

Figure 3:
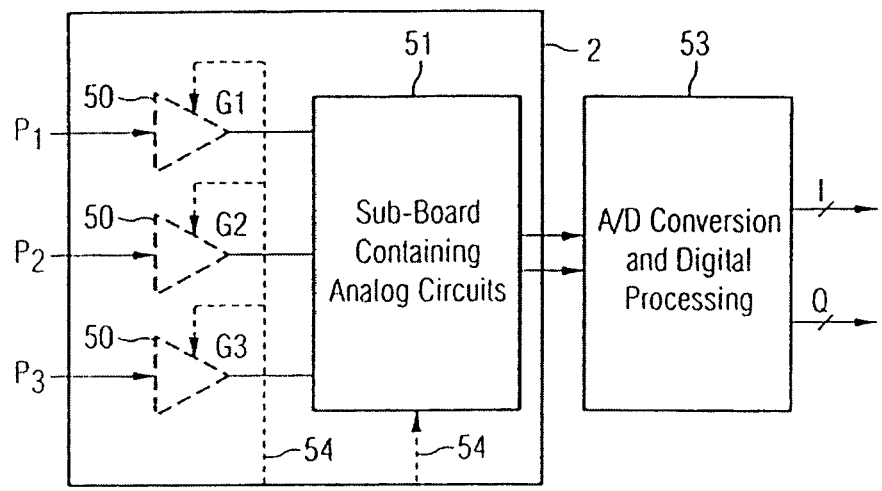
FIG. 3 shows the internal structure of the analog circuit board.
Figure 4:
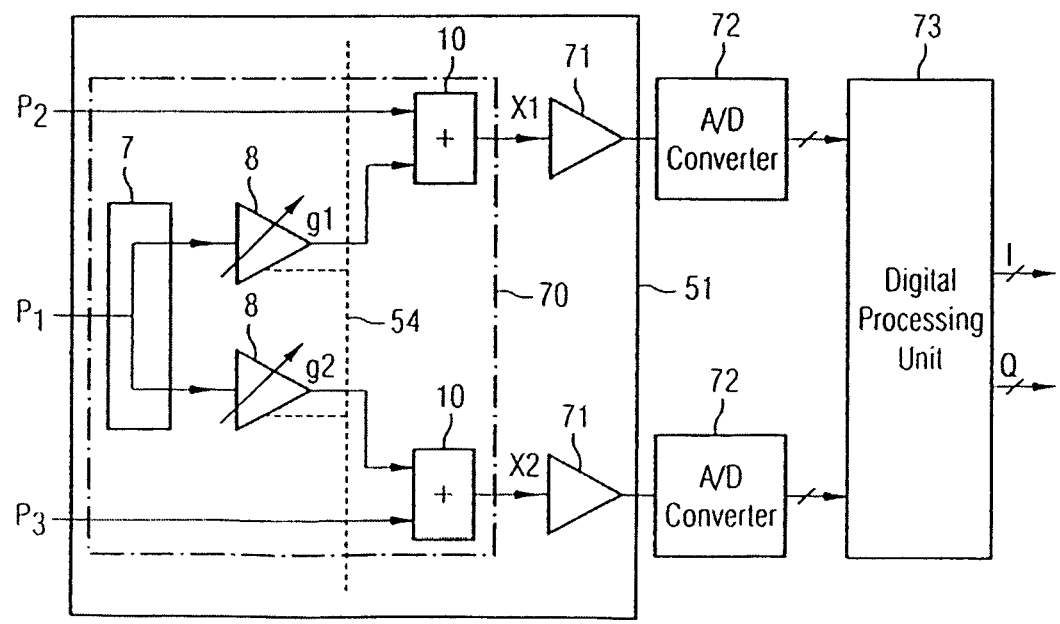
Figure 5:
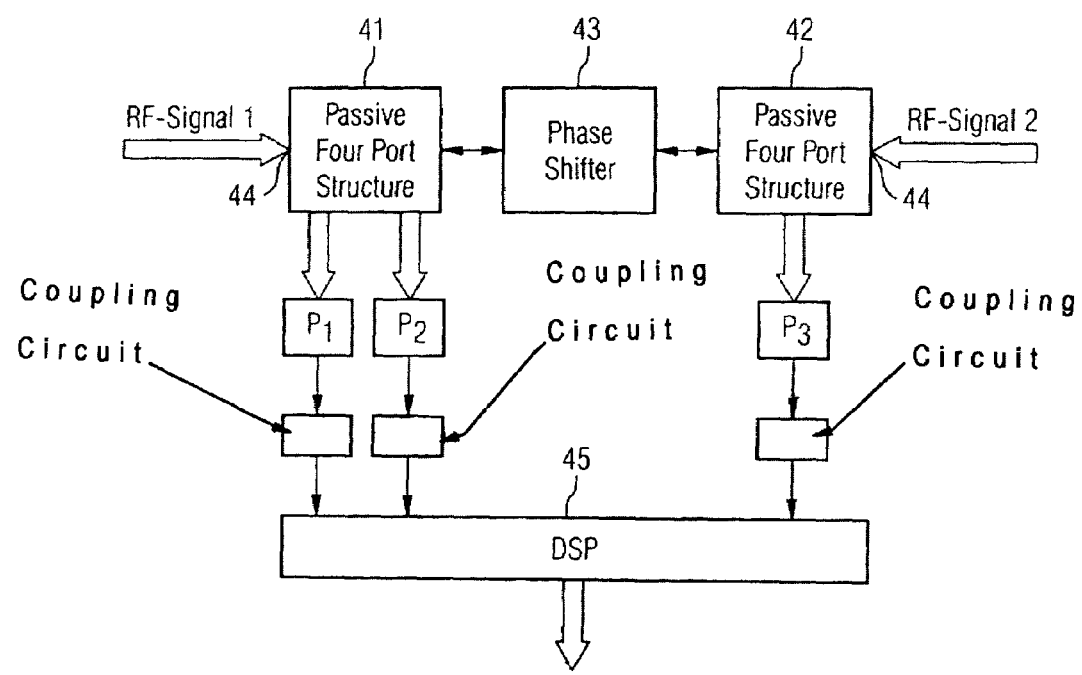
Figure 6:
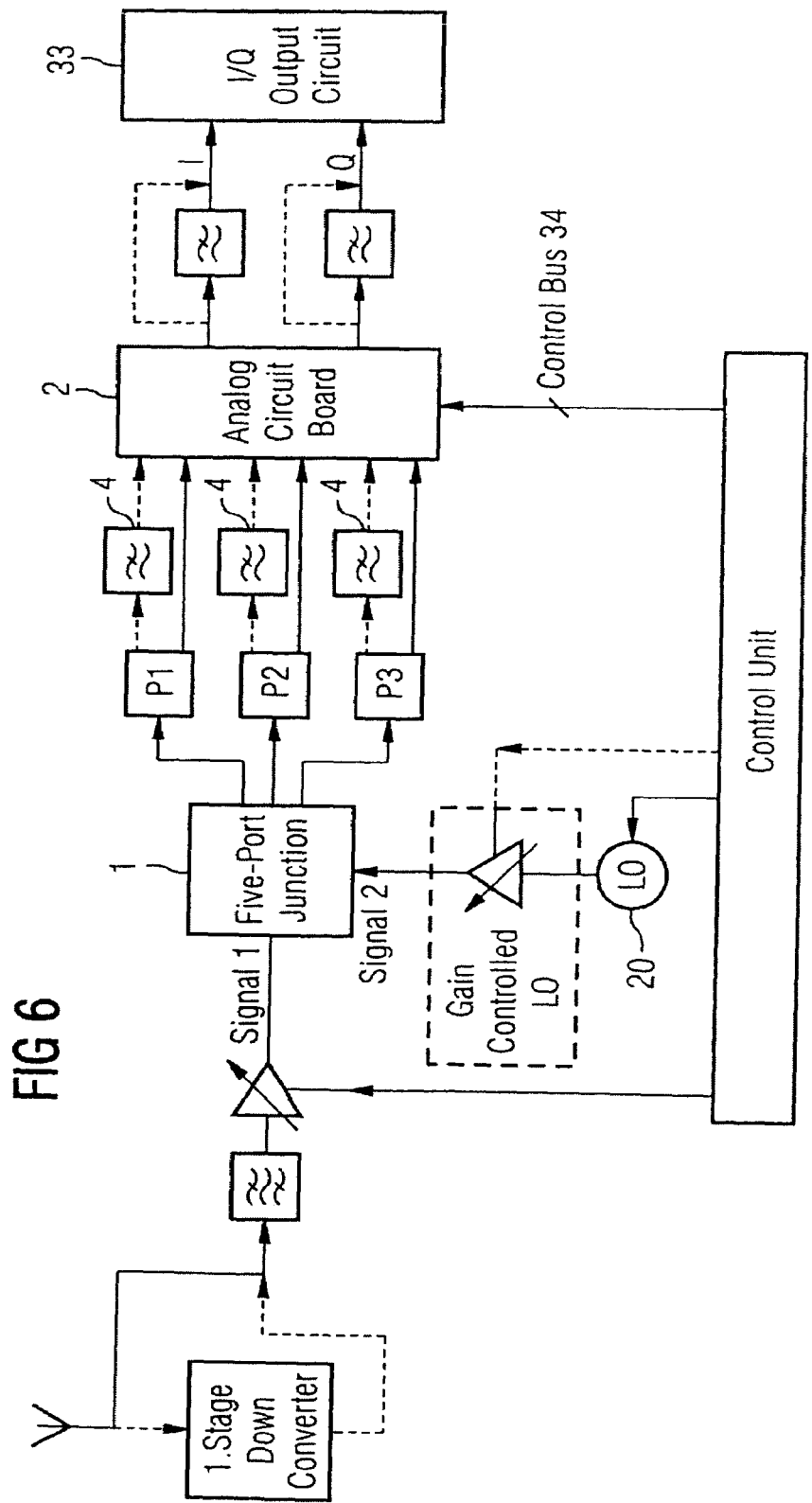

FIG. 4 shows the internal structure of an embodiment of the subboard comprised in the analog circuit board shown in FIG. 3, FIG. 5 shows the general concept of a five port junction device which is state of the art, FIG. 6 shows a general view of a receiver comprising an I/Q demodulator according to the state of the art, FIG. 7 shows the internal structure of an embodiment of the subboard comprised in the analog circuit board of the I/Q demodulator shown in FIG. 6 according to the state of the art.

In FIG. 1 the new structure of the proposed I/Q demodulator 60 according to the invention is shown. It comprises three power detectors, two A/D converters, no additional mixing circuits (no nonlinear elements for providing mixing process ) and one digital processing unit. By combination of a modulated RF signal 61 with a RF signal 62 originating from a local oscillator the calculation of the I/Q values can be performed.

As it can be seen in FIG. 2 the combination of the modulated RF signal 61 with the second RF signal 62 is made in a five-port structure 63 which outputs and supplies three signals, originating from the three power detectors, to an associated assembly 64.

The assembly 64 is shown in FIG. 3 comprising an analog circuit board 2 and an A/D conversion and digital processing unit 53. The output signals of the power detectors $P_1$, $P_2$, $P_3$ are respectively input to an amplifier 50 with optionally adjustable gain $G_1$, $G_2$, $G_3$. The gain of the amplifiers 50 with adjustable gain thereby can be optionally controlled by the control bus 54. The output signals of the amplifiers 50 are input to a subboard containing analog circuitry 51. The subboard 51 can also be optionally controlled by means of the control bus 54. The subboard 51 is connected to an A/D conversion and digital processing unit 53 which outputs the I component and the Q component of the thus demodulated RF signal.

FIG. 4 shows the internal structure of the subboard 51 comprised in the analog circuit board 2. One of the input signals $P_1$, is divided in two branches by means of a functional divider 7. Optionally each of the thus generated branches is then respectively amplified and inverted by a DC amplifier 8 (by supplying it to the inverted input of the operational amplifier), wherein the gain g1, g2 of the DC amplifier 8 can also be controllably adjusted by means of the control bus 54. The amplified output signals are given to two adding circuits 10 where they are combined with the non amplified input signals $P_2$, $P_3$ to generate output signals X1, X2 of the combination processing unit 70.

Note that alternatively to the DC amplifiers 8 attenuators with an adjustable attenuation rate can be provided depending on the application. If the signal P1 is not inverted along with the amplification, additional inverters may be provided or the adders may be replaced by subtracting units subtracting the signal P1 from the other output signals of the power amplifier.

Note that the combination processing unit 70 is operating in an analog manner and only comprises analog elements.

The functional dividers 7, the DC amplifiers 8 and the adding circuits represent therefore a combination unit 70 for combining the three output signals of the power sensors to two signals X1, X2 in a adjustable manner. The two output signals of the combination unit 70 can be optionally DC amplified 71 and then respectively supplied to an A/D converter 72. The digital outputs of the A/D converters 72 are further provided to a digital processing unit 73 where after the calculation of the digitized signals the I component and the Q component of the received modulated RF signal are given to the outputs. The calculation of the I/Q values of the modulated RF signal 61 is therefore effected in a digital manner (in contrast to the analog processing of the combination unit 70).

Considering the topology example of the FIG. 1 and FIG. 2 we can consider following relation in the case when Si presents the modulation of the RF signal and Signal S2 presents the complex value of the local oscillator (In the following equations a reference phase of the local oscillator is considered to be zero).

$$s_1 = S_0 d\, e^{j\phi} \quad (1)$$

$$s_2 = S_0 \quad (2)$$

The I/Q demodulator actually detects the complex ratio of the signals S1 and S2, or relative amplitude and phase related to the local oscillator. The amplitude ratio is d and $\phi$ presents phase difference.

$$s = \frac{s1}{s2} = de^{j\varphi} \quad I = d\cos\varphi \quad Q = d\sin\varphi \quad (3)$$

The topology of the FIG. 1 results in the following complex values (v1, v2 and v3) which are approaching the power sensors. Coefficients $k_{mn}$ are representing transfer functions from port n to the power sensor port m.

$$v_1 = k_{11} s_1, \; k_{12} = 0 \quad (4)$$

$$v_2 = k_{21} s_1 + k_{22} e^{-j\theta} s_2 \quad (5)$$

$$v_3 = k_{31} e^{-j\theta} s_1 + k_{32} s_2 \quad (6)$$

$$v_1 = k_{11} S_0 d\, e^{j\phi} \quad (7)$$

$$v_2 = k_{21} S_0 d\, e^{j\phi} + k_{22} S_0 e^{-j\theta} \quad (8)$$

$$v_3 = k_{31} S_0 d\, e^{j(\phi-\theta)} + k_{32} S_0 \quad (9)$$

We are assuming that signal S2 has a constant value, meaning for example that the LO does not change its signal power level. In that case we can introduce the new variable $V_{DC}$, like in (10).

$$V_{DC} = C|s_2|^2 = C S_0^2\text{-set DC voltage} \quad (10)$$

$$P_1 = C|v_1|^2 = C k_{11}^2 S_0^2 d^2 \quad (11)$$

$$P_2 = C|v_2|^2 = C S_0^2 [k_{21}^2 d^2 + k_{22}^2 + 2k_{21}k_{22} d\cos(\phi+\theta)] \quad (12)$$

$$P_3 = C|v_3|^2 = C S_0^2 [k_{31}^2 d^2 + k_{32}^2 + 2k_{31}k_{32} d\cos(\phi-\theta)] \quad (13)$$

P1, P2 and P3 are low frequency (quasi DC voltages) which exist after power detection by ideal diodes. The value of $\theta$ corresponds to the phase shift value from the five port structure and may considered as a constant.

$$P_2 = \frac{k_{21}^2}{k_{11}^2} P_1 + k_{22}^2 V_{DC} + 2k_{21}k_{22} V_{DC} d\cos(\varphi+\theta) \quad (14)$$

$$P_3 = \frac{k_{31}^2}{k_{11}^2} P_1 + k_{32}^2 V_{DC} + 2k_{31}k_{32} V_{DC} d\cos(\varphi-\theta) \quad (15)$$

After subcontracting power P1, multiplied with the related constant in equation (14) and (15) we may obtain two new equations with two unknown values:

$$X_1 = P_2 - \frac{k_{21}^2}{k_{11}^2} P_1 = k_{22}^2 V_{DC} + 2k_{21}k_{22} V_{DC}(I\cos\theta - Q\sin\theta) \quad (16)$$

$$X_2 = P_3 - \frac{k_{31}^2}{k_{11}^2} P_1 = k_{32}^2 V_{DC} + 2k_{31}k_{32} V_{DC}(I\cos\theta - Q\sin\theta) \quad (17)$$

The combination unit 70 implements the above equations (16) and (17). As it can be seen from (16) and (17) the multiplication coefficients $$\frac{k_{21}^2}{k_{11}^2} \text{ and } \frac{k_{31}^2}{k_{11}^2}$$

associated with P1 are implemented by the gains g1, g2 of the amplifiers 8 of the combination unit 70. For most of the practical architectures they are less than one. An implementation may therefore be achieved by using an adjustable attenuator structure instead of an analog inverted amplifier as shown in the drawings.

The values of the output signals $X_1$ and $X_2$ are then sampled by two A/D converters and supplied to the digital processing unit. In order to calculate the I/Q values following calculations are performed in the digital domain:

$$I = \frac{k_{21}k_{23} + k_{22}k_{31}}{4k_{21}k_{31}\cos\theta} + \frac{1}{4k_{21}k_{22}V_{DC}\cos\theta}X_1 + \frac{1}{4k_{31}k_{32}V_{DC}\cos\theta}X_2 \quad (18)$$

$$Q = -\frac{k_{21}k_{23} - k_{22}k_{31}}{4k_{21}k_{31}\sin\theta} - \frac{1}{4k_{21}k_{22}V_{DC}\sin\theta}X_1 + \frac{1}{4k_{31}k_{32}V_{DC}\sin\theta}X_2 \quad (19)$$

In two special cases, when the phase shift is 45°, we obtain a simplified equations for I and Q outputs (20–23)

Case 1: $\theta = 45°$; $k_{11} = \frac{1}{2}$; $k_{12} = 0$;

$$k_{21} = \frac{1}{4}; \; k_{22} = \frac{1}{4}; \; k_{31} = \frac{1}{8}; \; k_{32} = \frac{1}{2};$$

$$I = -\frac{5\sqrt{2}}{4} + \frac{4\sqrt{2}}{V_{DC}}(X_2 + X_1) \quad (20)$$

$$Q = -\frac{3\sqrt{2}}{4} + \frac{4\sqrt{2}}{V_{DC}}(X_2 - X_1) \quad (21)$$

Case 2: $\theta = 45°$; $k_{11} = \frac{1}{3}$; $k_{12} = 0$;

$$k_{21} = \frac{1}{3}; \; k_{22} = \frac{1}{4}; \; k_{31} = \frac{1}{6}; \; k_{32} = \frac{1}{2};$$

$$I = -\frac{15\sqrt{2}}{16} + \frac{3\sqrt{2}}{V_{DC}}(X_2 + X_1) \quad (22)$$

$$Q = -\frac{9\sqrt{2}}{16} + \frac{3\sqrt{2}}{V_{DC}}(X_2 - X_1) \quad (23)$$

The invention claimed is:

1. I/Q demodulator having a first input for the RF signal (61) to be demodulated and a second input for a RF signal (62) originating from a local oscillator (20), the demodulator (60) combining the two RF signals (61,62) to generate three output signals for power detectors, characterized by an analog combination unit (70) for combining three power signals (P1, P2, P3) output of the power detectors to two signal branches (X1, X2) for further digital processing to obtain I/Q values characterized in that the combination unit (70) comprises a splitting unit (7) for splitting one of the power signals (P1) into two subbranches.

2. I/Q demodulator according to claim 1, characterized by means (8) for individually adjusting the power of the subbranches.

3. I/Q demodulator according to claim 1, characterized in that the analog combination unit comprises means (10) for adding DC values of the subbranches to respectively one of the remaining two power signals (P2, P3).

4. I/Q demodulator according to claim 1, characterized by two A/D converter (72) for the output signals of the combination unit (51).

5. I/Q demodulator according to claim 1, characterized in that the outputs of the A/D converter (72) are supplied to a digital processing unit (73).

6. I/Q demodulator according to claim 5, characterized in that the digital processing unit (73) is designed to calculate I/Q values of the modulated RF signal (61).

7. Mobile communication device, characterized in that it comprises an I/Q demodulator according claim 1.

8. Method of demodulating a modulated RE signal, characterized by the following steps:
    generating three output signals for power detectors by combining a first RF signal (61) to be demodulated with a second RF signal (62) originating from a local oscillator (20), and
    processing (70) to three power signals (P1, P2, P3) of the power detectors to two signal branches (X1, X2) in an analog manner, and
    processing digitally the two signal branches (X1, X2) to detect the I/Q values of the first RE signal (61) characterized in that one of the three power signals is split (7) in two subbranches.

9. Method according to claim 8, characterized in that the power of the subbranches is controllably adjusted.

10. Method according to claim 9, characterized in that each subbranch is combined (10) with respectively one of the remaining two power signals.

11. Method according to claim 10, characterized in that each of the signals resulting from the combination of each subbranch with one of the remaining two power signals is supplied to an A/D converter (72).

12. Method according to claim 8, characterized in that the outputs of the A/D converter (72) are supplied to a digital processing unit (73).

13. Method according to claim 12, characterized in that the digital processing unit (73) calculates the I/Q values of the modulated RF signal (61).

14. An I/Q demodulator comprising a first input for a first RF signal to be demodulated, a second input for a second RF signal supplied from a local oscillator, power detectors for the first and second RF signals to generate three power output signals, an analog combination unit for combining said three power output signals generated by said power detectors to provide two signal branches for further digital processing to obtain I/Q values, said analog combination unit including a splitting unit for splitting one of said power output signals into two subbranches for further digital processing with the remaining power output signals.

\* \* \* \* \*